United States Patent
Rinne et al.

(10) Patent No.: US 11,333,715 B2
(45) Date of Patent: May 17, 2022

(54) INDICATOR FOR FAILED CAPACITOR UNIT

(71) Applicant: General Electric Technology GmbH, Baden (CH)

(72) Inventors: Tuomo Rinne, Uusimaa (FI); Jari Tapani Kotiniitty, Pirkanmaa (FI); Alan John Swade, Atlanta, GA (US); William J. De Vries, Saratoga Springs, NY (US); Jussi Pontys, Pirkanmaa (FI); Pekka Nevalainen, Uusimaa (FI)

(73) Assignee: General Electric Technology GmbH, Baden (CH)

( * ) Notice: Subject to any disclaimer, the term of this patent is extended or adjusted under 35 U.S.C. 154(b) by 250 days.

(21) Appl. No.: 16/819,281

(22) Filed: Mar. 16, 2020

(65) Prior Publication Data

US 2021/0286021 A1    Sep. 16, 2021

(51) Int. Cl.
*G01R 31/12* (2020.01)
*G01R 31/64* (2020.01)
*G01R 31/371* (2019.01)
*G01R 31/01* (2020.01)

(52) U.S. Cl.
CPC .......... *G01R 31/64* (2020.01); *G01R 31/016* (2013.01); *G01R 31/371* (2019.01)

(58) Field of Classification Search
CPC ...... G01R 31/016; G01R 31/08; G01R 31/40; G01R 31/64; G01R 31/371; G01R 27/2605; G01R 19/10; G01R 19/15; G01R 19/16509; G01R 19/16523
See application file for complete search history.

(56) References Cited

U.S. PATENT DOCUMENTS

| | | | | |
|---|---|---|---|---|
| 5,153,565 A | * | 10/1992 | Schweitzer, Jr. .... | G01R 15/188 324/133 |
| 5,220,311 A | * | 6/1993 | Schweitzer, Jr. ...... | G01R 31/08 324/133 |
| 5,497,096 A | * | 3/1996 | Banting ................. | G01R 15/18 324/543 |
| 6,433,698 B1 | * | 8/2002 | Schweitzer, Jr . | G01R 19/16509 324/133 |

(Continued)

FOREIGN PATENT DOCUMENTS

| | | |
|---|---|---|
| BR | PI0 901 057 A2 | 12/2010 |
| CA | 1 124 796 A | 6/1982 |
| DE | 10 27 769 B | 4/1958 |

OTHER PUBLICATIONS

Search Report and Written Opinion issued in PCT/IB2021/040117, dated Jun. 16, 2021, 14 pages.

*Primary Examiner* — Thang X Le
(74) *Attorney, Agent, or Firm* — Eversheds Sutherland (US) LLP

(57) ABSTRACT

The disclosure generally relates to a failure indicator for providing an indicator that a failure has occurred on a capacitor unit of a capacitor bank. In some embodiments, the failure indicator may include a magnetic element, and the failure indicator may be configured to move from a first orientation to a second orientation based on a mechanical or electromagnetic impulse in the capacitor unit resulting from a failure of the first capacitor unit. In some embodiments, the magnetic element may maintain the first failure indicator in the second orientation to indicate the failure of the first capacitor unit.

20 Claims, 9 Drawing Sheets

(56) References Cited

U.S. PATENT DOCUMENTS

| | | |
|---|---|---|
| 10,254,323 B2 | 4/2019 | Berkcan et al. |
| 11,085,956 B2 * | 8/2021 | Nagayasu .............. G01R 31/64 |
| 2004/0070474 A1 | 4/2004 | Wu et al. |
| 2015/0177287 A1 | 6/2015 | Baburaj |

* cited by examiner

INDICATOR FOR FAILED CAPACITOR UNIT

FIELD OF THE DISCLOSURE

This disclosure relates to capacitors, and in particular to, systems, methods, and apparatuses for providing an indicator for a failed capacitor unit in a capacitor bank.

BACKGROUND OF THE DISCLOSURE

A conventional electrical capacitor bank may be protected and monitored by an unbalance relay which may provide an indication when a capacitor unit failure occurs in the bank. However, it may be relatively expensive to find out which of the many capacitor units in the bank have failed. For example, some conventional systems may implement current and/or voltage measurement devices and a data transmitter to collect and share the information with an operator. These conventional solutions may also require a power source. However, high voltage capacitors may be relatively inexpensive components with a long lifetime expectancy so customers have been sometimes reluctant to invest money to implement capacitor monitoring systems.

BRIEF SUMMARY OF THE DISCLOSURE

In certain embodiments of the disclosure, one or more systems, methods, apparatus, and the like can provide an indication that a capacitor unit has experienced a failure. In at least one embodiment, a system can be provided. In some embodiments, the system may include one or more capacitor units comprising a first capacitor unit. In some embodiments, the system may also include a first failure indicator coupled to the first capacitor unit, the first failure indicator including a first magnetic element, the first failure indicator being configured to move from a first orientation to a second orientation based on a mechanical or electromagnetic impulse in the first capacitor unit resulting from a failure of the first capacitor unit, wherein the first magnetic element maintains the first failure indicator in the second orientation to indicate the failure of the first capacitor unit.

In some embodiments, the first failure indicator provides a visual indication of the failure of the first capacitor unit.

In some embodiments, the first failure indicator is held in the first orientation based on a magnetic force between the first magnetic element of the first failure indicator and the first capacitor unit.

In some embodiments, the first failure indicator moving from the first orientation to the second orientation is further based on the mechanical or electromagnetic impulse overcoming the magnetic force between the first magnetic element of the failure indicator and the capacitor unit.

In some embodiments, the first failure indicator is further configured to be manually moved from the second orientation back to the first orientation.

In some embodiments, the first failure indicator comprises a horizontally or vertically-oriented elongated member, wherein the first magnetic element is affixed to a first end of the horizontally or vertically-oriented elongated member.

In some embodiments, the horizontally or vertically oriented elongated member further comprises a second end opposite to the first end, and is further configured to rotate about the second end, such that in the first orientation the first end is located above the second end and in the second orientation the first end is located below the second end.

In some embodiments, the first failure indicator is coupled to the first capacitor unit at a lid, a side, or a bottom of the capacitor unit.

In some embodiments, the system may also include a second capacitor unit including a second failure indicator, the second failure indicator remaining in a first orientation, wherein the second failure indicator remaining in the first orientation indicates that the second capacitor unit is operational.

In at least one embodiment, a failure indicator for a capacitor unit may be provided. In some embodiments, the failure indicator may include a first magnetic element, the failure indicator being configured to move from a first orientation to a second orientation based on a mechanical or electromagnetic impulse in the capacitor unit resulting from a failure of the capacitor unit, wherein the first magnetic element maintains the failure indicator in the second orientation to indicate the failure of the first capacitor unit.

In some embodiments, the failure indicator provides a visual indication of the failure of the capacitor unit.

In some embodiments, the failure indicator is held in the first orientation based on a magnetic force between the first magnetic element of the failure indicator and the capacitor unit.

In some embodiments, the failure indicator moving from the first orientation to the second orientation is further based on the mechanical impulse overcoming the magnetic force between the first magnetic element of the failure indicator and the capacitor unit.

In some embodiments, the failure indicator is further configured to be manually moved from the second orientation back to the first orientation.

In some embodiments, the failure indicator includes a horizontally or vertically-oriented elongated member, wherein the first magnetic element is affixed to a first end of the vertically-oriented elongated member.

In some embodiments, the horizontally or vertically oriented elongated member further comprises a second end opposite to the first end, and is further configured to rotate about the second end, such that in the first orientation the first end is located above the second end and in the second orientation the first end is located below the second end.

In some embodiments, the failure indicator is coupled to the capacitor unit at a lid, a side, or a bottom of the capacitor unit.

In some embodiments, the failure indicator includes a second capacitor unit including a second failure indicator, the second failure indicator remaining in a first orientation, wherein the second failure indicator remaining in the first orientation indicates that the second capacitor unit is operational.

In at least one embodiment, a system may be provided. In some embodiments, the system includes one or more capacitor units comprising a first capacitor unit. In some embodiments, the system includes a first failure indicator coupled to the first capacitor unit, the first failure indicator including a first magnetic element, the first failure indicator comprising a horizontally or vertically-oriented elongated member, wherein the first magnetic element is affixed to a first end of the horizontally or vertically-oriented elongated member, wherein the vertically oriented elongated member further comprises a second end opposite to the first end, and is further configured to rotate about the second end, such that in a first orientation the first end is located above the second end and in a second orientation the first end is located below the second end, wherein the first failure indicator is configured to move from a first orientation to a second orientation based on a mechanical or electromagnetic impulse overcoming a magnetic force between the first magnetic element of the first failure indicator and the first capacitor unit in the first capacitor unit, wherein the mechanical impulse results from a failure of the first capacitor unit, and wherein the first magnetic element maintains the first failure indicator in the second orientation to indicate the failure of the first capacitor unit.

Additional systems, methods, apparatus, features, and aspects can be realized through the techniques of various embodiments of the disclosure. Other embodiments and aspects of the disclosure are described in detail herein and are considered a part of the claimed subject matter. Other features can be understood and will become apparent with reference to the description and to the drawings.

BRIEF DESCRIPTION OF THE DRAWINGS

Figure 1A:
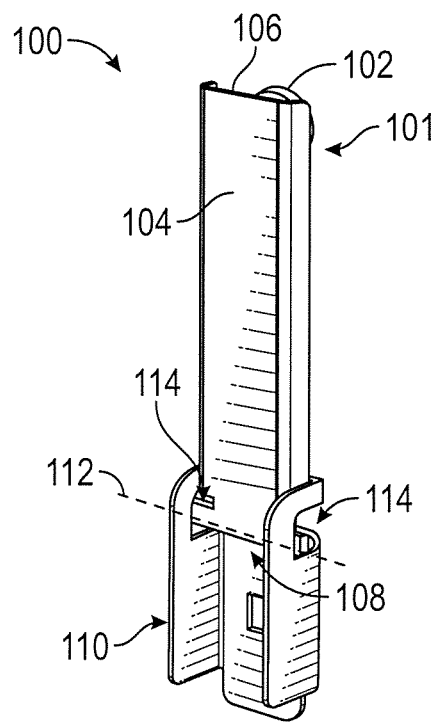

Having thus described the disclosure in general terms, reference will now be made to the accompanying drawings, which are not necessarily drawn to scale, and wherein:

FIG. 1A shows an example failure indicator in a first position in accordance with an exemplary embodiment of the disclosure.

Figure 1B:
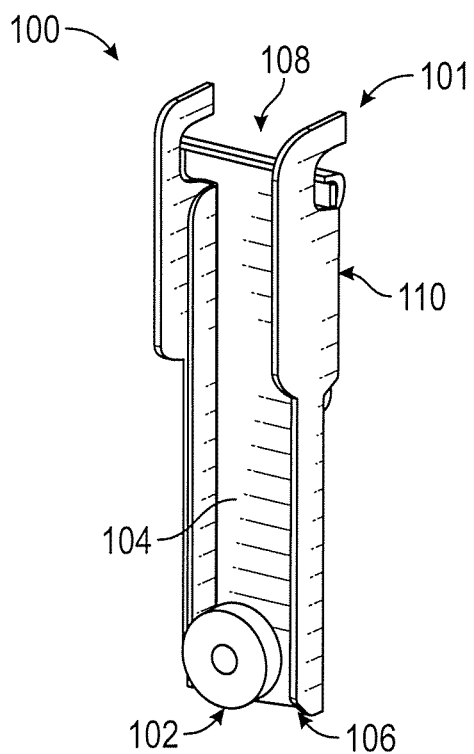

FIG. 1B shows an example failure indicator in a second position in accordance with an exemplary embodiment of the disclosure.

Figure 2:
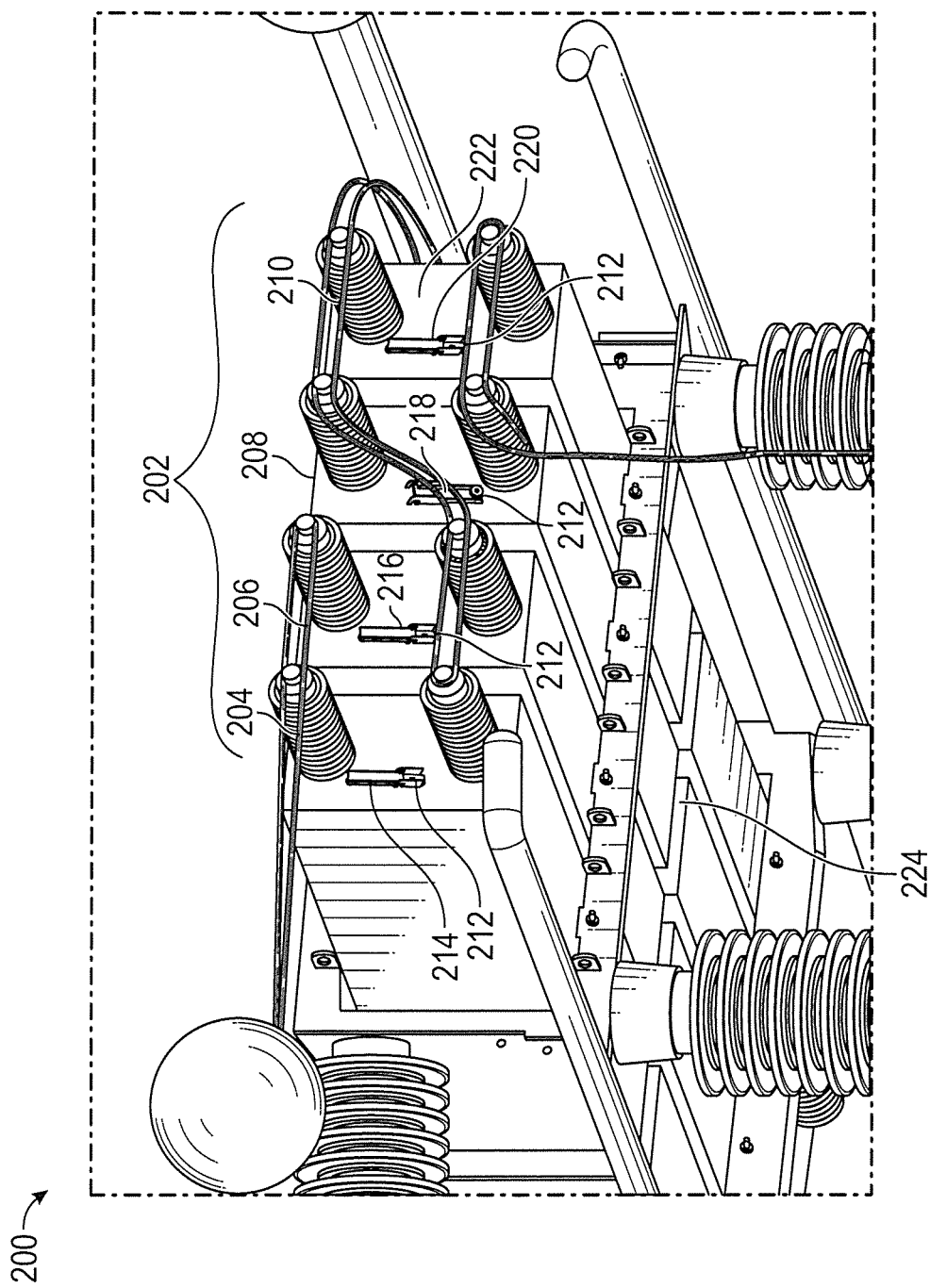

FIG. 2 shows an example capacitor bank including one or more failure indicators in accordance with an exemplary embodiment of the disclosure.

Figure 3A:
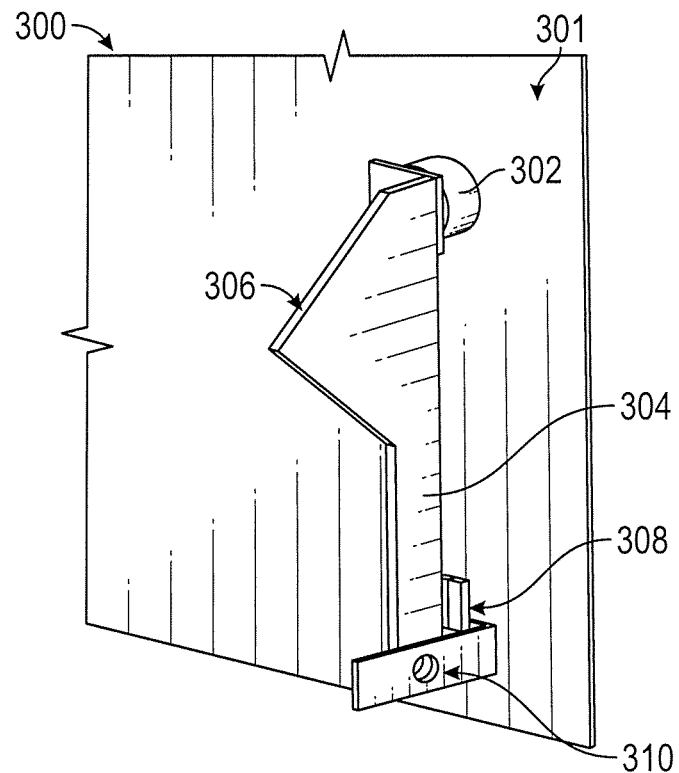

FIG. 3A shows an example failure indicator in a first position in accordance with an exemplary embodiment of the disclosure.

Figure 3B:
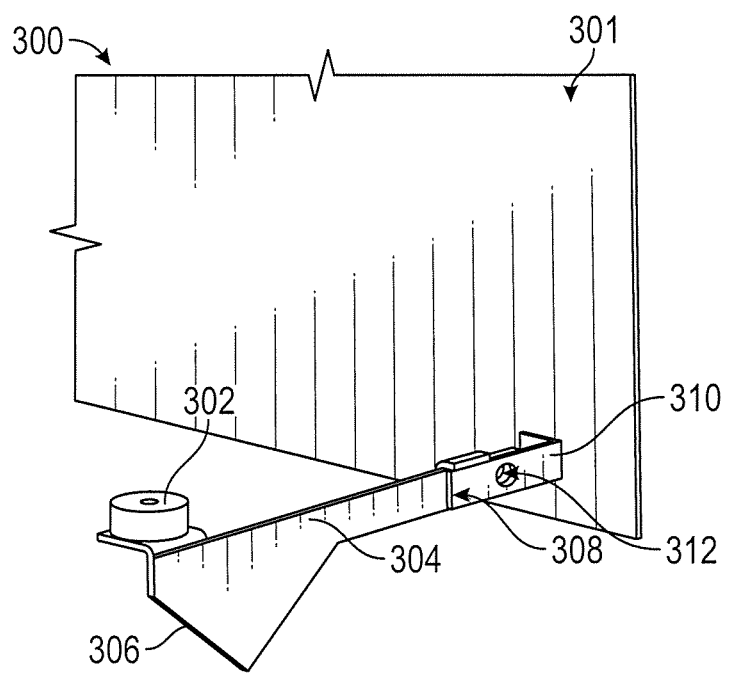

FIG. 3B shows an example failure indicator in a second position in accordance with an exemplary embodiment of the disclosure.

Figure 3C:
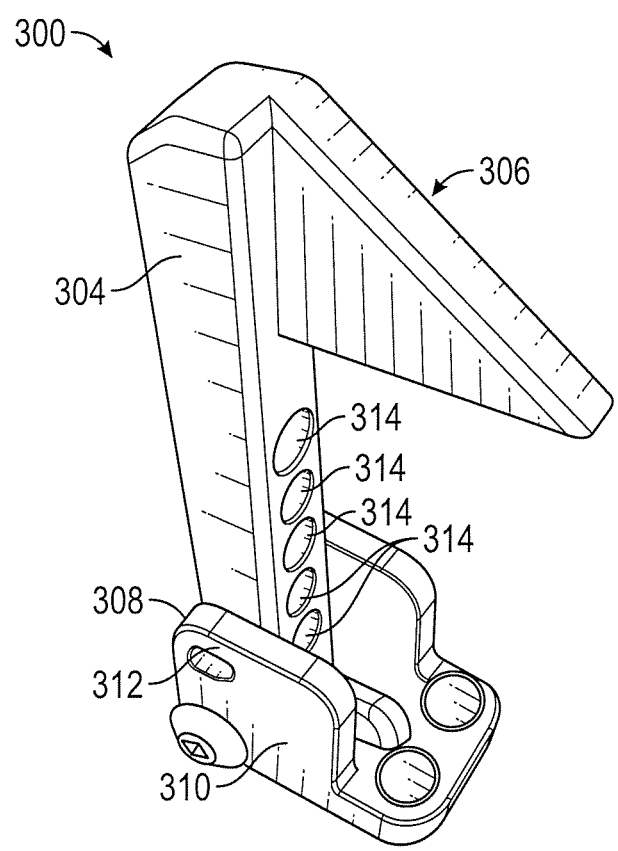

FIG. 3C shows an example failure indicator in a second position in accordance with an exemplary embodiment of the disclosure.

Figure 4A:
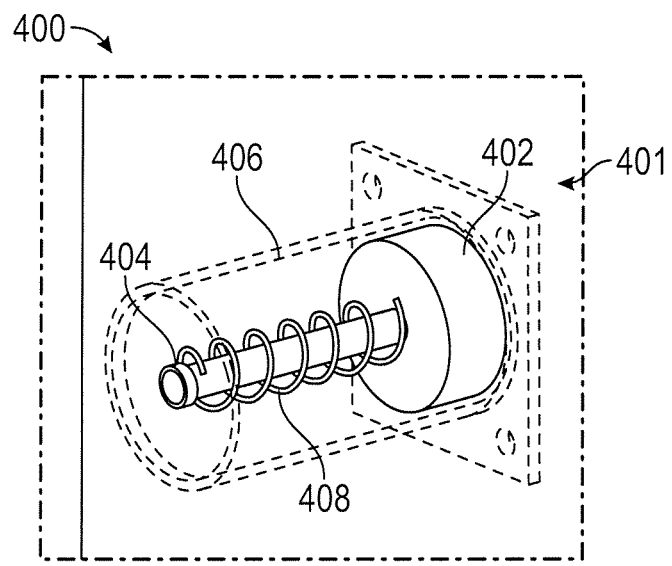

FIG. 4A shows an example failure indicator in a first position in accordance with an exemplary embodiment of the disclosure.

Figure 4B:
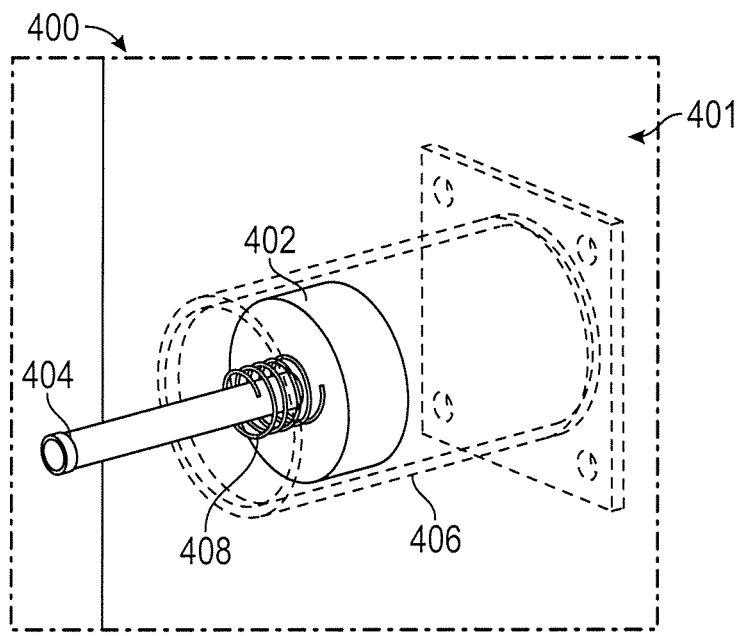

FIG. 4B shows an example failure indicator in a second position in accordance with an exemplary embodiment of the disclosure.

Figure 5A:
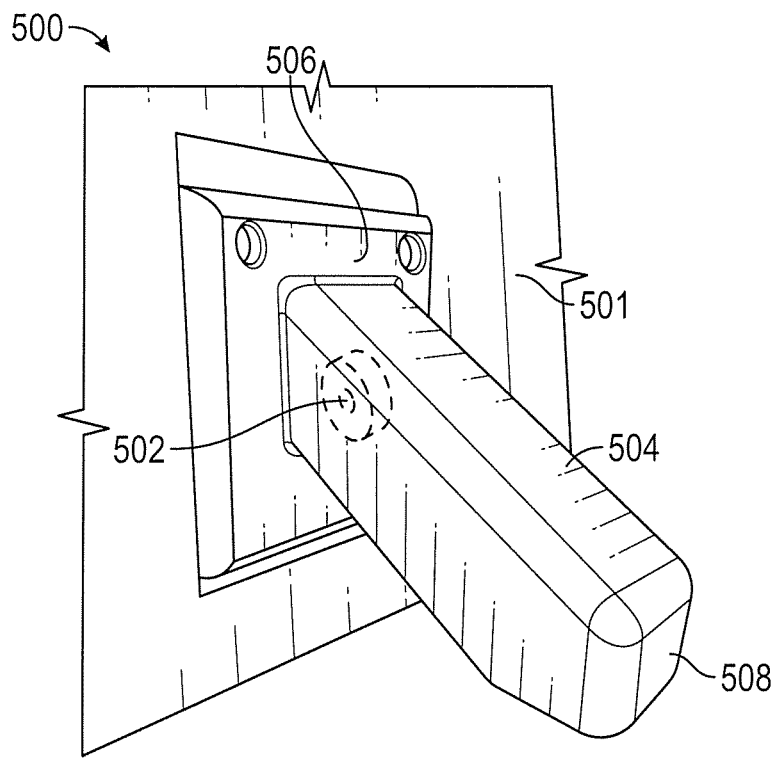

FIG. 5A shows an example failure indicator in a first position in accordance with an exemplary embodiment of the disclosure.

Figure 5B:
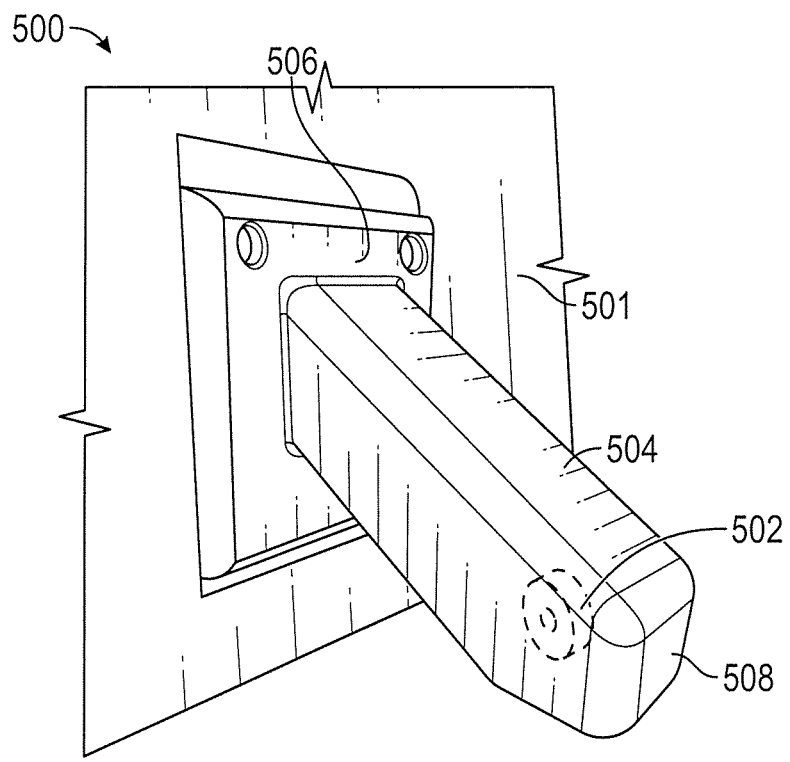

FIG. 5B shows an example failure indicator in a second position in accordance with an exemplary embodiment of the disclosure.

Figure 6A:
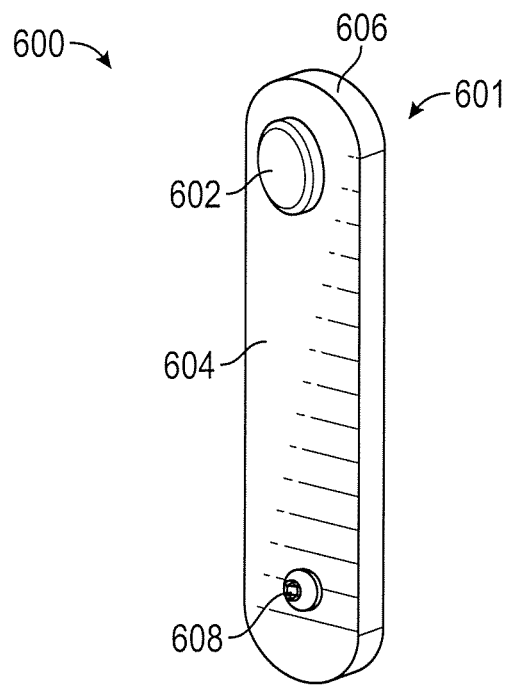

FIG. 6A shows an example failure indicator in a first position in accordance with an exemplary embodiment of the disclosure.

Figure 6B:
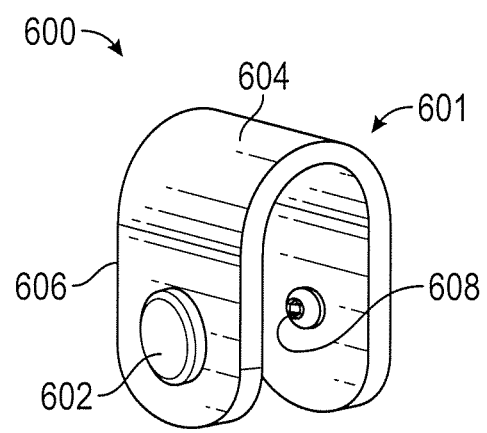
Figure 7A:
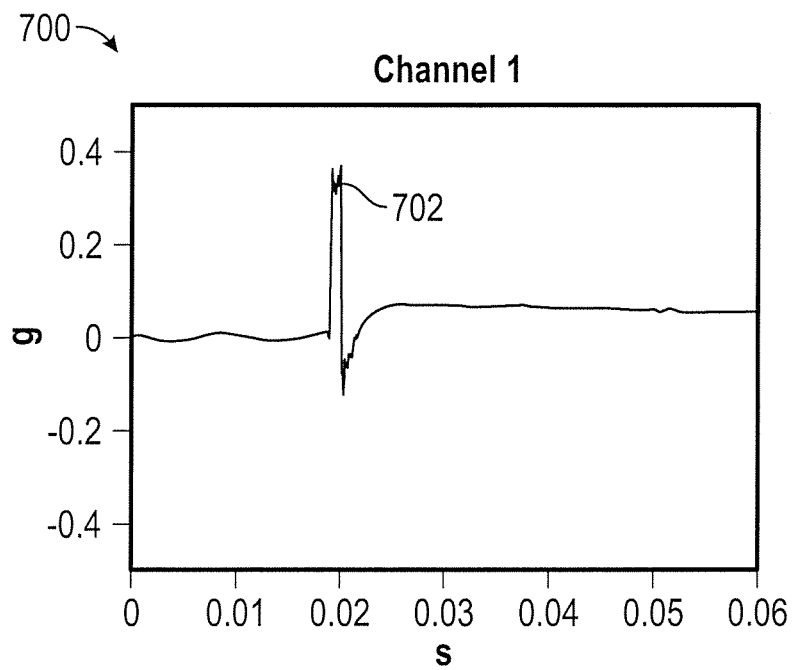
Figure 7B:
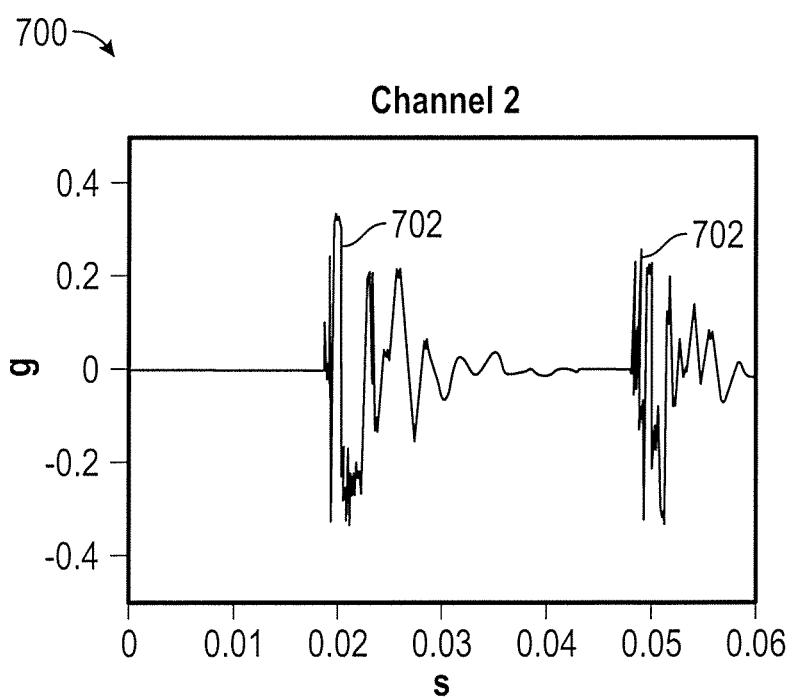
Figure 7C:
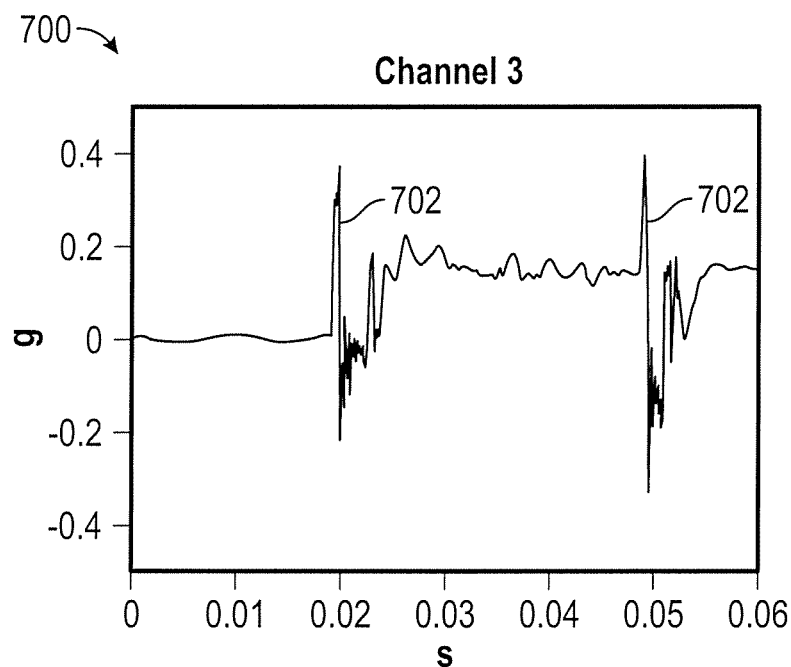
Figure 7D:
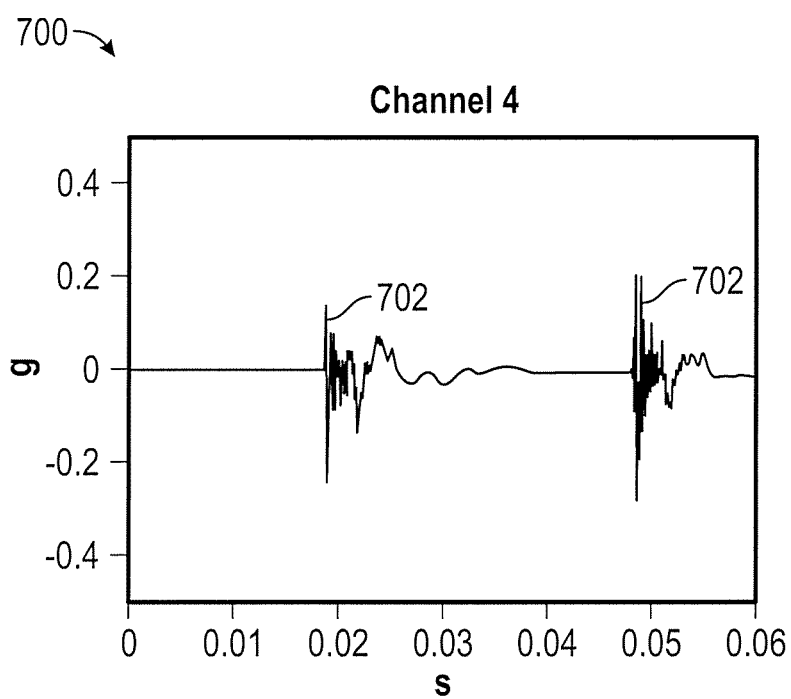

FIG. 6B shows an example failure indicator in a second position in accordance with an exemplary embodiment of the disclosure.

FIGS. 7A-7D show example plots of acceleration over a period time in accordance with an exemplary embodiment of the disclosure.

Embodiments of the disclosure are described more fully below with reference to the accompanying drawings, in which example embodiments of the disclosure are shown. This disclosure may, however, be embodied in many different forms and should not be construed as limited to the example embodiments set forth herein; rather, these embodiments are provided so that this disclosure will be thorough and complete, and will fully convey the scope of the disclosure to those skilled in the art. Like numbers refer to like, but not necessarily the same or identical, elements throughout.

The following embodiments are described in sufficient detail to enable at least those skilled in the art to understand and use the disclosure. It is to be understood that other embodiments would be evident based on the present disclosure and that process, mechanical, material, dimensional, process equipment, and parametric changes may be made without departing from the scope of the present disclosure.

In the following description, numerous specific details are given to provide a thorough understanding of various embodiments of the disclosure. However, it will be apparent that the disclosure may be practiced without these specific details. In order to avoid obscuring the present disclosure, some well-known system configurations and process steps may not be disclosed in full detail. Likewise, the drawings showing embodiments of the disclosure are semi-diagrammatic and not to scale and, particularly, some of the dimensions are for the clarity of presentation and may be exaggerated in the drawings. In addition, where multiple embodiments are disclosed and described as having some features in common, for clarity and ease of illustration, description, and comprehension thereof, similar and like features will ordinarily be described with like reference numerals even if the features are not identical.

DETAILED DESCRIPTION OF THE DISCLOSURE

In some embodiments, systems, methods, apparatus, and the like can provide an indication that a capacitor unit has experienced a failure. The failure may be a breakdown of capacitor element insulation leading to a short circuit and discharge of capacitor elements. In some embodiments, such a capacitor unit may be a single capacitor unit of a group of capacitor units that may form a collective capacitor bank. Each of the capacitor units may have their own associated indicators (hereinafter referred to as "failure indicator"), and each failure indicator may be a physical element attached to the capacitor unit. This may allow an operator to visually inspect the failure indicators on the capacitor units of the capacitor bank to determine which of the capacitor units have experienced a failure. The failure indicators may be attached to any number of portions of the capacitor unit, such as a lid or a bottom of the capacitor unit (or any other location).

In some embodiments, the failure indicator may provide an indication that a capacitor unit has experienced a failure through the use of multiple physical orientations, where one or more orientations may indicate a failure has not occurred and one or more orientations may indicate that a failure has occurred. For example, the failure indicator being in a first orientation may indicate that a failure has not occurred and the failure indicator being in a second orientation may indicate that a failure has occurred. The failure indicator may transition from the first orientation to the second orientation based on a vibration in the capacitor unit caused by pressure impulse that results upon an internal failure of the capacitor unit. For example, the impulse may be a mechanical or electromagnetic impulse. This vibration may impact the failure indicator and cause it to transition from the first orientation to the second orientation. Examples of various embodiments of such failure indicators may be provided below with respect to the description of the figures. In some instances, to ensure that the failure indicator remains in the first orientation until the failure of the capacitor unit, the failure indicator may include one or more magnetic elements with magnetic forces strong enough to keep the failure indicator attached to the capacitor unit in the first orientation, but also weak enough such that the vibration from the capacitor unit may overcome the magnetic force and allow the failure indicator to transition into the second orientation. As mentioned above, this may allow an operator to visually locate the failed capacitor units when standing next to the capacitor bank. The operator may still use existing local or remote monitoring systems to identify that a problem exists in the capacitor bank, and the use of the failure indicators may reduce operator time in identifying the specific capacitor units that have experienced a failure while visually inspecting the capacitor units themselves. Additionally, the failure indicator as described above may be mechanical without any power source or electronics.

One technical effect and/or solution of certain embodiments of the disclosure can include visually indicating one or more apparent capacitor failures within a bank or group of multiple capacitors. Further, another technical effect and/or solution of certain embodiments of the disclosure can include providing a relatively inexpensive indicator of one or more apparent capacitor failures within a bank or group of multiple capacitors, wherein the indicator is relatively cost effective to install, maintain, and/or reset when needed. Moreover, another technical effect and/or solution of certain embodiments of the disclosure can include improving reliability and efficiency With reference to the figures, FIG. 1A may show an example embodiment of a failure indicator 100 as described herein. FIG. 1A may show the failure indicator 100 in a first orientation, where the failure indicator 100 being in a first orientation provides an indication that a capacitor unit (not shown in the drawing) to which the failure indicator 100 is coupled has not experienced a failure. The failure may be a breakdown of capacitor element insulation leading to a short circuit and discharge of capacitor elements. As shown in FIG. 1A, the failure indicator 100 may include a magnetic element 102 and an elongated member 104. In some embodiments, the magnetic element may be affixed to a first end 106 of the elongated member 104, and in some cases the first end 106 may be located at the upper end of the elongated member 104. The magnetic element 102 may be affixed to a side of the elongated member 104 that faces the capacitor unit 101, such that the magnetic element 102 is located between the elongated member 104 and the capacitor unit 101. This configuration may allow for the magnetic element to hold the failure indicator 100 in the first orientation through a magnetic force between the magnetic element 102 and the capacitor unit 101. The failure indicator 100 may also be configured such that a second end 108 of the elongated member 104 is moveably attached to a fixed portion 110 of the failure indicator 100. In some instances, the second end 108 of the elongated member 104 may be located at a bottom end of the elongated member 104. Additionally, the second end 108 elongated member 104 may be moveably attached to the fixed portion 110 of the failure indicator 100 in the sense that the second end 108 may be adjustable as to allow the elongated member 104 to move from the first orientation to a second orientation (for example, a second orientation as depicted in FIG. 1B described below). The failure indicator 100 being in the second orientation may provide an indication that a failure has occurred in the capacitor unit 101. In some embodiments, this movability may involve the second end 108 being configured to rotate about an imaginary axis 112 through the second end 108 as depicted in FIG. 1A. For example, as depicted in the figure, the fixed portion 110 of the failure indicator 100 may contain two holes 114 for receiving extruding portions of the second end 108 of the elongated member 104. The imaginary axis 112 may pass through the extruding portions of the second end 108 and through the holes 114, such that the elongated member 104 may rotate about the second end 108.

In some embodiments, as mentioned above, upon a failure of the capacitor unit, the failure indicator 100 may move from a first orientation to a second orientation. FIG. 1B may show an example of a failure indicator 100 being in the second orientation. That is, the failure indicator in FIG. 1B may be the same or similar to the failure indicator 100 shown in FIG. 1B, with the failure indicator 100 in FIG. 1A being in the first orientation, which may indicate no failure in the capacitor unit 101 and the failure indicator 100 in FIG. 1B being in the second orientation, which may indicate that a failure has occurred in the capacitor unit 101. In some embodiments, the failure indicator 100 may move to from the first orientation to the second orientation based on an impulse that may occur during failure of the capacitor unit 101. The impulse may be, for example, an electromagnetic or mechanical impulse, but may also include any other type of impulse. The impulse may cause the failure indicator 100 to move from the first orientation to the second orientation by overcoming the magnetic force between the magnetic element 102 of the failure indicator 100 and the capacitor unit 101. That is, the force of the impulse may be greater than the magnetic force, causing the magnet, and correspondingly, the elongated member 104 of the failure indicator 100 to move away from the capacitor unit. As the force of the impulse pushes the elongated member 104 away from the capacitor unit, the elongated member 104 may rotate about the imaginary axis 112 through the second end 108, causing the elongated member 104 to fall into the second orientation. The elongated member 104 (and correspondingly the failure indicator 100) being in the second orientation may provide a visual indicator to an operator that a failure has occurred on the capacitor unit 101 associated with the failure indicator 100 that is in the second orientation. The operator may then address the capacitor unit 101 and manually place the failure indicator 100 back in the first orientation to indicate that the capacitor unit 101 is no longer experiencing a failure.

FIG. 2 shows an example capacitor bank 200 including one or more capacitor units 202 (for example, capacitor unit 204, capacitor unit 206, capacitor unit 208, and capacitor unit 210). Although the capacitor bank 200 only shows four capacitor units, the capacitor bank 200 may include any number of capacitor units 202. Each of the capacitor units 202 in the capacitor bank 200 may include an associated failure indicator 212 (for example, failure indicator 214, failure indicator 216, failure indicator 218, and failure indicator 220). That is, capacitor unit 204 may be associated with failure indicator 214, capacitor unit 206 may be associated with failure indicator 216, capacitor unit 208 may be associated with failure indicator 218, and capacitor unit 210 may be associated with failure indicator 220. In some instances, each capacitor unit 202 may be associated with any other number of failure indicators 212 as well, and capacitor units 202 may also share failure indicators 212. The failure indicators 212 may be located on any portion of the capacitor unit 202, such as a lid 222 or bottom 224 of the capacitor unit 202 (as well as any other location). The failure indicators 212 may be the same as the failure indicator 100 as described above with respect to FIGS. 1A-1B, as well as any other failure indicator described herein.

In some embodiments, each of the failure indicators 212 (for example, failure indicator 214, failure indicator 216, failure indicator 218, and failure indicator 220) may provide a visual indication as to whether the capacitor unit 202 associated with the failure indicator 212 has experienced a failure. As illustrated in FIG. 2, failure indicator 214, failure indicator 216, and failure indicator 220 may be in a first orientation as described above with respect to FIGS. 1A-1B. These failure indicators being in the first orientation may provide a visual indication that capacitor units 204, 206, and 210 associated with failure indicators 214, 216, and 200 respectively, have not experienced a failure. Additionally, failure indicator 218 may be in a second orientation as described above with respect to FIGS. 1A-1B. The failure indicator 218 being in the second orientation may provide a visual indication that the capacitor unit 208 associated with failure indicator 218 may have experienced a failure. An operator may be able to visually inspect the capacitor bank 200 and see that the failure indicator 218 is in the second orientation. This may allow the operation to quickly discern which capacitor units 202 of the capacitor bank 200 have experienced a failure. As mentioned above, the operator may subsequently move the failure indicator 218 back to the first orientation when the failure of the capacitor unit 208 is addressed.

FIG. 3A may show an example embodiment of a failure indicator 300 in a first orientation. The first orientation of the failure indicator 300 may be similar to the first orientation of the failure indicator 100 in that failure indicator 300 being in the first orientation may provide a visual indication that a capacitor unit 301 onto which the failure indicator 300 is attached has not experienced a failure. The failure indicator 300 may be an alternate embodiment to the failure indicator of FIGS. 1A-1B or any of the other failure indicators described herein. The failure indicator 300 may function similarly to the failure indicator 100. For example, the failure indicator 300 may include a magnetic element 302 and an elongated member 304, or any other elements of the failure indicator 100 as described above. The failure indicator 300 may differ from the failure indicator 100 in that the failure indicator 300 may include an extruding element 306 that extrudes from the elongated member 304. The extruding element 306 may serve to better assist an operator in visually identifying which orientation (for example, the first orientation or the second orientation) the failure indicator 300 is currently in. Although FIGS. 3A-3C depict the extruding element 306 as being triangular in shape, it may also be any other shape. Additionally, the failure indicator 300 may differ from the failure indicator 100 through the manner in which a second end 308 of the elongated member 304 is moveably attached to a fixed portion 310 of the failure indicator 300. For example, a portion of the second end 308 may protrude through a hole 312 in the fixed portion 310 of the failure indicator 300. This configuration may allow the elongated member 304, and consequentially the failure indicator 300, to rotate about an imaginary axis through the hole 312.

FIG. 3B may show an example embodiment of the failure indicator 300 in a second orientation. As with the failure indicator 100, the failure indicator 300 being in the second orientation may provide a visual indicator that a failure has occurred at the capacitor unit 301. The failure indicator 300 may move from the first orientation to the second orientation in a similar manner as the failure indicator 100. That is, the failure indicator 300 may move to from the first orientation to the second orientation based on an impulse that may occur during failure of the capacitor unit 301. The impulse may be, for example, an electromagnetic or mechanical impulse. The impulse may cause the failure indicator 300 to move from the first orientation to the second orientation by overcoming the magnetic force between the magnetic element 302 of the failure indicator 300 and the capacitor unit 301. That is, the force of the impulse may be greater than the magnetic force, causing the magnet, and correspondingly, the elongated member 304 of the failure indicator 300 to move away from the capacitor unit. As the force of the impulse pushes the elongated member 304 away from the capacitor unit, the elongated member 304 may rotate about an imaginary axis through the second end 308, causing the elongated member 304 to fall into the second orientation.

FIG. 3C may show another example embodiment of the failure indicator 300 in the second orientation. As shown in FIG. 3C, the failure indicator 300 may include one or more holes 314 on the elongated member 304 that may be used to house the magnetic element 302. That is, the location of the magnetic element 302 may not be limited to just a first end 307 of the elongated member 304. This may similarly apply to any of the other failure indicators described herein (that is, the location of any of the magnetic elements may not be limited). Additionally, FIG. 3C may depict that other elements of the failure indicator 300 may not necessarily be limited to the embodiments shown in FIGS. 3A-3B. For example, the second end 308 of the elongated member 304 may be moveably attached to the fixed portion 310 of the failure indicator 300 through two holes (for example, a first hole 314 and a second hole not shown in the figure). In this manner, the failure indicator 300, as well as any of the other failure indicators described herein) may be configured in any number of different ways that may allow the failure indicator 300 to move from the first orientation to the second orientation, and may not be limited to the exact structural descriptions provided herein.

FIG. 4A may show an example embodiment of a failure indicator 400 in a first orientation. The failure indicator 400 depicts in FIG. 4A, as well as FIG. 4B described below, may include some similarities to the other failure indicators described herein. For example, failure indicator 400 may include a magnetic element 402 and an elongated member 404, where position of the elongated member 404 may be used by an operator to discern whether a capacitor unit 401 that the failure indicator 400 is attached to has experienced a failure. The failure indicator 400 may differ from other failure indicators described herein as well. For example, the failure indicator 400 may include a housing 406 and a spring 408. In some embodiments, the housing 406 may be a structural element that physically surrounds the magnetic element 402, the elongated member 404, and/or the spring 408. The housing 406 may be cylindrical in shape with an opening in the middle to house the aforementioned failure indicator 400 elements, but may also alternatively be any other shape. The housing 406 as depicted in FIG. 4A may be transparent, but may also be nontransparent. The housing 406 may also conform to the shape of the magnetic element 402 such that the magnetic element may be fixed to a particular path within the housing 406.

FIG. 4B may show an example embodiment of a failure indicator 400 in a second orientation. As with any of the other failure indicators described herein, the failure indicator 400 being in the second orientation may provide a visual indication to an operator that a failure has occurred at the capacitor unit 401 (that is, the capacitor unit associated with the failure indicator 400). In the particular embodiment depicted in FIG. 4B (as well as FIG. 4A), the second orientation may involve the elongated member 404 protruding outwards from the housing 406 such that the elongated member 404 is visible outside of the housing 406. In the first orientation, for example, the elongated member 404 may either be fully contained within the housing 406 or may extrude from the housing 406, but may extrude less than when the failure indicator 400 is in the second orientation as shown in FIG. 4B.

In some embodiments, the movement of the failure indicator 400 from the first orientation to the second orientation may be similar to other failure indicators described herein, but may differ in some regards. For example, the failure indicator 400 may move to from the first orientation to the second orientation based on an impulse that may occur during failure of the capacitor unit 401. The impulse may be, for example, an electromagnetic or mechanical impulse. The impulse may cause the failure indicator 400 to move from the first orientation to the second orientation by overcoming the magnetic force between the magnetic element 402 of the failure indicator 400 and the capacitor unit 401. That is, the force of the impulse may be greater than the magnetic force, causing the magnet, and correspondingly, the elongated member 404 of the failure indicator 400 to move away from the capacitor unit. However, as depicted in FIG. 4B, instead of the failure indicator 400 moving to the second orientation through a rotation of the elongated member 404 (for example, as described with respect to failure indicator 100 and failure indicator 200), the magnetic element 402 (and the elongated member 404) may translate through the housing 406 to the second orientation. That is, the first orientation may involve the magnetic element 402 being at a first end 410 of the housing 406 where the capacitor unit 401 is located, and the second orientation may involve the magnetic element 402 being at or proximal to a second end 412 of the housing 406 that may be on an opposite end of the housing 406 from the first end 410. Additionally, the magnetic element 402 may be held at the second orientation through the spring 408. That is, in the first orientation the spring 408 may be exerting little to no force on the magnetic element 402, but in the second orientation the spring 408 may be exerting a force on the magnetic element in a direction away from the capacitor unit 401. That is, in the first orientation the spring 408 may be exerting little to no force on the magnetic element 402, but in the second orientation the spring 408 may be exerting a force on the magnetic element in a direction away from the capacitor unit 401. This may allow the failure indicator 400 to remain in the second orientation until an operator is able to visually identify the failure indicator 400 and manually reset the failure indicator 400 back to the first orientation.

FIG. 5A may show an example embodiment of a failure indicator 500 in a first orientation. The failure indicator 500 depicted in FIG. 5A, as well as FIG. 5B described below, may include some similarities to the other failure indicators described herein. For example, failure indicator 500 may include a magnetic element 502 and an elongated member 504. The failure indicator 500 may differ from other failure indicators described herein as well. For example, the elongated member 504 of the failure indicator 500 may also completely encompass the magnetic element 502. The elongated member 504 may also be transparent so that the magnetic element 502 may be visible inside the elongated member 504. In the first orientation, the magnetic element of the failure indicator may be attached to a first end 506 of the capacitor unit 501 to which the failure indicator 500 is attached. As may be the case with the other failure indicators described herein, the magnetic element 502 may be attached at the first end 506 through an electromagnetic force.

FIG. 5B may show an example embodiment of a failure indicator 500 in a second orientation. As with any of the other failure indicators described herein, the failure indicator 500 being in the second orientation may provide a visual indication to an operator that a failure has occurred at the capacitor unit 501 (that is, the capacitor unit associated with the failure indicator 500). In the particular embodiment depicted in FIG. 5B (as well as FIG. 5A), the second orientation may involve the magnetic element 502 being at a different location that the first end 506 of the elongated member 504. For example, the elongated member 504 may be fixed, and the magnetic element 502 may simply detach from the first end 506 of the elongated member 504 and fall to a second end 508 of the elongated member 504. An operator may be able to visually inspect the failure indicator 500 and see the magnetic element 502 at the second end 508 of the elongated member to discern that a failure has occurred at the capacitor unit 501. The operator may then be able to move the magnetic element 502 from the second end 508 to the first end 506 using a magnet to draw the magnetic element 502 through the elongated member 504.

FIG. 6A may show an example embodiment of a failure indicator 600 in a first orientation. The failure indicator 600 depicted in FIG. 6A, as well as FIG. 6B described below, may include some similarities to the other failure indicators described herein. For example, failure indicator 600 may include a magnetic element 602 and an elongated member 604. The magnetic element 602 may be affixed to a first end 606 of the elongated member 604, and in some cases the first end 606 may be located at the top end of the elongated member 604. The magnetic element 602 may hold the failure indicator 600 in the first orientation through a magnetic force between the magnetic element 602 and the capacitor unit 601. The failure indicator 600 may differ from other failure indicators described herein as well. For example, the elongated member 604 may be made of a relatively flexible material, such as silicone, rubber, etc. Additionally, a second end 608 of the elongated member 604 may be affixed to the capacitor unit 601, such that it may not be moveable as is the case in other failure indicators 600 described herein.

FIG. 6B may show an example embodiment of a failure indicator 600 in a second orientation. As may be the case with any of the other failure indicators described herein, the failure indicator 600 being in the second orientation may provide a visual indication that the capacitor unit 601 to which the failure indicator 600 is attached may have experienced a failure. In some embodiments, the failure indicator 600 may move to from the first orientation to the second orientation based on an impulse that may occur during failure of the capacitor unit 601. The impulse may be, for example, an electomagnetic or mechanical impulse. The impulse may cause the failure indicator 600 to move from the first orientation to the second orientation by overcoming the magnetic force between the magnetic element 602 of the failure indicator 600 and the capacitor unit 601. That is, the force of the impulse may be greater than the magnetic force, causing the magnetic element 602, and correspondingly, the elongated member 604 of the failure indicator 600 to move away from the capacitor unit 601. In some instances, due to the flexible nature of the elongated member 604, the impulse may cause the first end 606 of the elongated member 604 at which the magnetic element 602 is located to fall away from the capacitor unit 601, which may effectively cause the elongated member 604 to bend in the manner depicted in FIG. 6B. The elongated member 604 being in this second orientation in which it is bent as depicted may provide the visual indication to the operator that a failure has occurred at the capacitor unit 601. The operator may then move the first end 606 of the elongated member 604 back to the first position in which the magnetic element 602 is magnetically attached to the capacitor unit 601.

FIGS. 7A-7D show example plots of acceleration over a period time, and may be representative of impulses that result from a failure in a capacitor unit. The plots 700 in FIGS. 7A-7D may depict four testing scenarios for various capacitor units (such as the capacitor units described above). These testing scenarios depict example impulses 702 that may occur during a failure of a capacitor unit. These impulses 702 shown in the plots 700 may be the impulses that trigger the failure indicator (for example, any of the failure indicator described herein) to move from the first orientation to the second orientation so that the operator may visually inspect a capacitor bank and quickly discern which capacitor units have experienced a failure.

That which is claimed is:

1. A system comprising:
one or more capacitor units comprising a first capacitor unit; and
a first failure indicator coupled to the first capacitor unit, the first failure indicator including a first magnetic element, the first failure indicator being configured to move from a first orientation to a second orientation based on a mechanical or electromagnetic impulse in the first capacitor unit resulting from a failure of the first capacitor unit, wherein the first failure indicator being in the second orientation to indicate the failure of the first capacitor unit.

2. The system of claim 1, wherein the first failure indicator provides a visual indication of the failure of the first capacitor unit.

3. The system of claim 1, wherein the first failure indicator is held in the first orientation based on a magnetic force between the first magnetic element of the first failure indicator and the first capacitor unit.

4. The system of claim 3, wherein the first failure indicator moving from the first orientation to the second orientation is further based on the mechanical or electromagnetic impulse overcoming the magnetic force between the first magnetic element of the failure indicator and the capacitor unit.

5. The system of claim 1, wherein the first failure indicator is further configured to be manually moved from the second orientation back to the first orientation.

6. The system of claim 1, wherein the first failure indicator comprises a horizontally or vertically-oriented elongated member, wherein the first magnetic element is affixed to a first end of the horizontally or vertically-oriented elongated member.

7. The system of claim 6, wherein the horizontally or vertically oriented elongated member further comprises a second end opposite to the first end, and is further configured to rotate about the second end, such that in the first orientation the first end is located above the second end and in the second orientation the first end is located below the second end.

8. The system of claim 1, wherein the first failure indicator is coupled to the first capacitor unit at a lid, a side, or a bottom of the capacitor unit.

9. The system of claim 1, further comprising a second capacitor unit including a second failure indicator, the second failure indicator remaining in a first orientation, wherein the second failure indicator remaining in the first orientation indicates that the second capacitor unit is operational.

10. A failure indicator for a capacitor unit comprising:
a first magnetic element, the failure indicator being configured to move from a first orientation to a second orientation based on a mechanical or electromagnetic impulse in the capacitor unit resulting from a failure of the capacitor unit, wherein the failure indicator being in the second orientation to indicate the failure of the first capacitor unit.

11. The failure indicator of claim 10, wherein the failure indicator provides a visual indication of the failure of the capacitor unit.

12. The failure indicator of claim 10, wherein the failure indicator is held in the first orientation based on a magnetic force between the first magnetic element of the failure indicator and the capacitor unit.

13. The failure indicator of claim 10, wherein the failure indicator moving from the first orientation to the second orientation is further based on the mechanical impulse overcoming the magnetic force between the first magnetic element of the failure indicator and the capacitor unit.

14. The failure indicator of claim 10, wherein the failure indicator is further configured to be manually moved from the second orientation back to the first orientation.

15. The failure indicator of claim 10, further comprising a horizontally or vertically-oriented elongated member, wherein the first magnetic element is affixed to a first end of the vertically-oriented elongated member.

16. The failure indicator of claim 15, wherein the horizontally or vertically oriented elongated member further comprises a second end opposite to the first end, and is further configured to rotate about the second end, such that in the first orientation the first end is located above the second end and in the second orientation the first end is located below the second end.

17. The failure indicator of claim 10, wherein the failure indicator is coupled to the capacitor unit at a lid, a side, or a bottom of the capacitor unit.

18. The failure indicator of claim 10, further comprising a second capacitor unit including a second failure indicator, the second failure indicator remaining in a first orientation, wherein the second failure indicator remaining in the first orientation indicates that the second capacitor unit is operational.

19. A system comprising:
one or more capacitor units comprising a first capacitor unit; and
a first failure indicator coupled to the first capacitor unit, the first failure indicator including a first magnetic element, the first failure indicator comprising a horizontally or vertically-oriented elongated member, wherein the first magnetic element is affixed to a first end of the horizontally or vertically-oriented elongated member,
wherein the vertically oriented elongated member further comprises a second end opposite to the first end, and is further configured to rotate about the second end, such that in a first orientation the first end is located above the second end and in a second orientation the first end is located below the second end,
wherein the first failure indicator is configured to move from a first orientation to a second orientation based on a mechanical or electromagnetic impulse overcoming a magnetic force between the first magnetic element of the first failure indicator and the first capacitor unit in the first capacitor unit, wherein the mechanical impulse results from a failure of the first capacitor unit, and wherein the first failure indicator being in the second orientation to indicate the failure of the first capacitor unit.

20. The system of claim 19, wherein the first failure indicator being in the second orientation provides a visual indication of the failure of the first capacitor unit.

\* \* \* \* \*